(12) United States Patent
Yamaguchi et al.

(10) Patent No.: US 9,603,272 B2
(45) Date of Patent: Mar. 21, 2017

(54) LID STRUCTURE AND ELECTRONIC DEVICE

(71) Applicant: FUJITSU LIMITED, Kawasaki-shi, Kanagawa (JP)

(72) Inventors: Shingo Yamaguchi, Kawasaki (JP); Satoshi Watanabe, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 70 days.

(21) Appl. No.: 14/276,457

(22) Filed: May 13, 2014

(65) Prior Publication Data

US 2015/0022955 A1 Jan. 22, 2015

(30) Foreign Application Priority Data

Jul. 18, 2013 (JP) ................................ 2013-149725

(51) Int. Cl.
*H04M 1/02* (2006.01)
*H05K 5/02* (2006.01)
*G06F 1/16* (2006.01)

(52) U.S. Cl.
CPC ......... *H05K 5/0239* (2013.01); *G06F 1/1656* (2013.01)

(58) Field of Classification Search
CPC .......... H05K 5/03; H05K 5/0239; G06F 1/16
USPC ............................................ 361/679.02, 683
See application file for complete search history.

(56) References Cited

U.S. PATENT DOCUMENTS 6,519,142 B1 * 2/2003 Lai ........................ G06F 1/1626
345/156

| 8,045,323 | B2 * | 10/2011 | Murakata | H05K 5/0086 |
| | | | | 361/679.01 |
| 2009/0190292 | A1 * | 7/2009 | Sasaki | H05K 5/0239 |
| | | | | 361/679.01 |
| 2011/0043973 | A1 * | 2/2011 | Tai | G06F 1/181 |
| | | | | 361/679.01 |
| 2011/0116240 | A1 * | 5/2011 | Wang | H05K 5/0239 |
| | | | | 361/728 |
| 2013/0137290 | A1 * | 5/2013 | Chang | H01R 13/447 |
| | | | | 439/377 |
| 2013/0293073 | A1 * | 11/2013 | Tsai | H05K 5/061 |
| | | | | 312/229 |

FOREIGN PATENT DOCUMENTS

JP 08-78864 3/1996
JP 11-145638 5/1999

(Continued)

OTHER PUBLICATIONS

Japanese Office Action mailed Jan. 25, 2017 in related Japanese Application No. 2013-149725.

*Primary Examiner* — Tuan T Dinh
*Assistant Examiner* — Rockshana Chowdhury
(74) *Attorney, Agent, or Firm* — Staas & Halsey LLP

(57) ABSTRACT

A lid structure includes: a housing; a lid body configured to open and close an opening of the housing; an elastic member configured to be compressed by the housing and the lid body around the opening in a closing position where the lid body closes the opening; and a shaft member configured to allow movement of the lid body along an opening formation surface where the opening is formed and move the lid body come close to the opening formation surface from front to move the lid body from a facing position of facing around the opening to the closing position.

20 Claims, 13 Drawing Sheets

(56) References Cited

FOREIGN PATENT DOCUMENTS

| JP | 2005-260184 | 9/2005 |
| JP | 2005-5783 | 1/2008 |
| JP | 2008-174296 | 7/2008 |
| JP | 2010-2514 | 1/2010 |
| WO | 2013/011676 | 1/2013 |

* cited by examiner

LID STRUCTURE AND ELECTRONIC DEVICE

CROSS-REFERENCE TO RELATED APPLICATION

This application is based upon and claims the benefit of priority of the prior Japanese Patent Application No. 2013-149725, filed on Jul. 18, 2013, the entire contents of which are incorporated herein by reference.

FIELD

Embodiments discussed herein are related to a lid structure and an electronic device.

BACKGROUND

A lid is equipped to allow closing of an opening of a housing.

A related technique is disclosed in Japanese Laid-open Patent Publication No. 2005-5783.

SUMMARY

According to one aspect of the embodiments, a lid structure includes: a housing; a lid body configured to open and close an opening of the housing; an elastic member configured to be compressed by the housing and the lid body around the opening in a closing position where the lid body closes the opening; and a shaft member configured to allow movement of the lid body along an opening formation surface where the opening is formed and move the lid body come close to the opening formation surface from front to move the lid body from a facing position of facing around the opening to the closing position.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A guide mechanism that guides a shaft support portion is equipped in such a manner that a lid equipped to allow closing of an opening of a housing comes close to or goes away from the opening while sliding obliquely to a plane including the opening.

In a structure where a lid body comes close to a surface having an opening of a housing formed thereon to close the opening, the lid body may be locked in a closing position of the opening.

Figure 1:
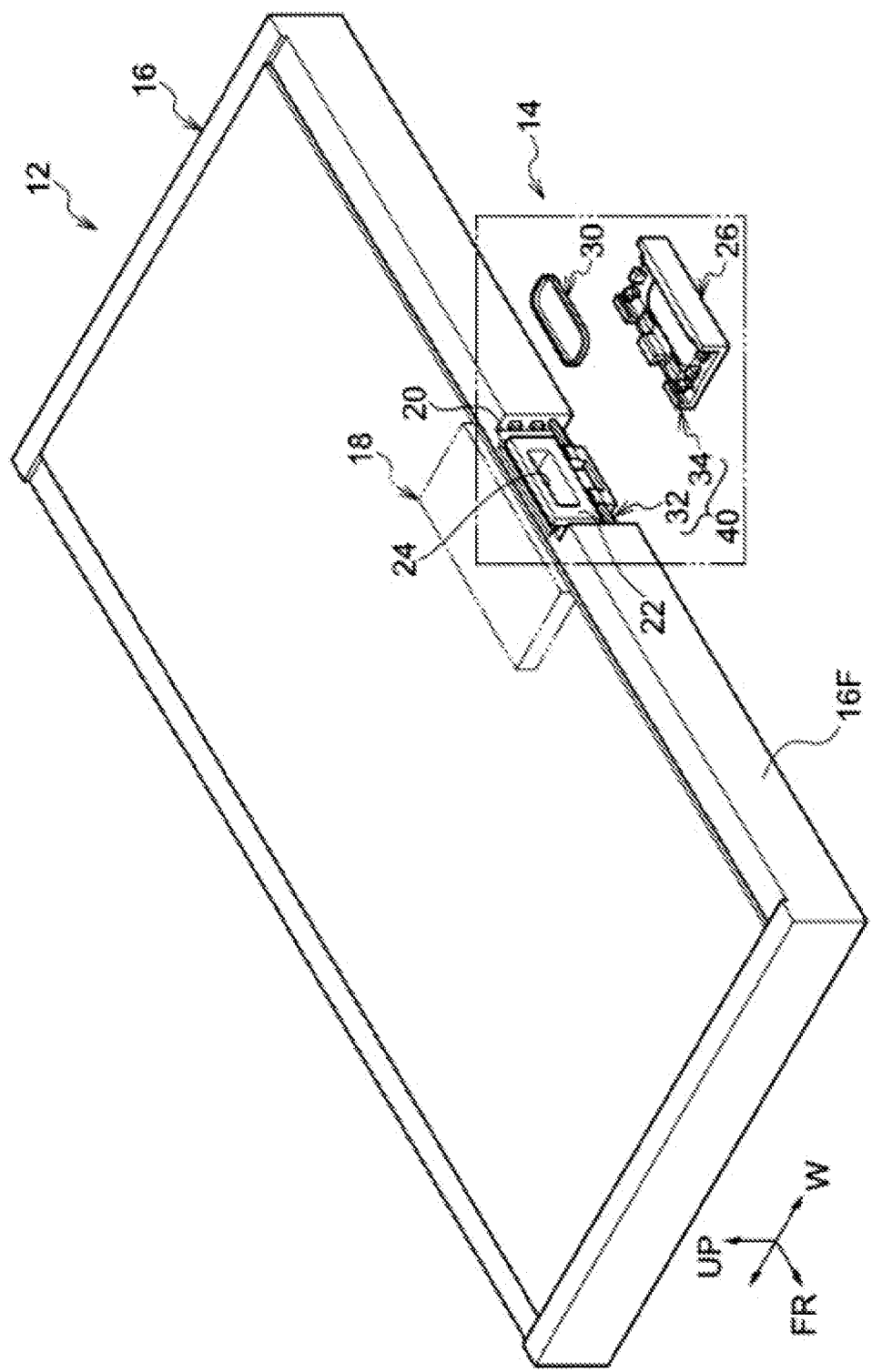
FIG. 1 illustrates an example of an exploded perspective view of an electronic device.
Figure 2:
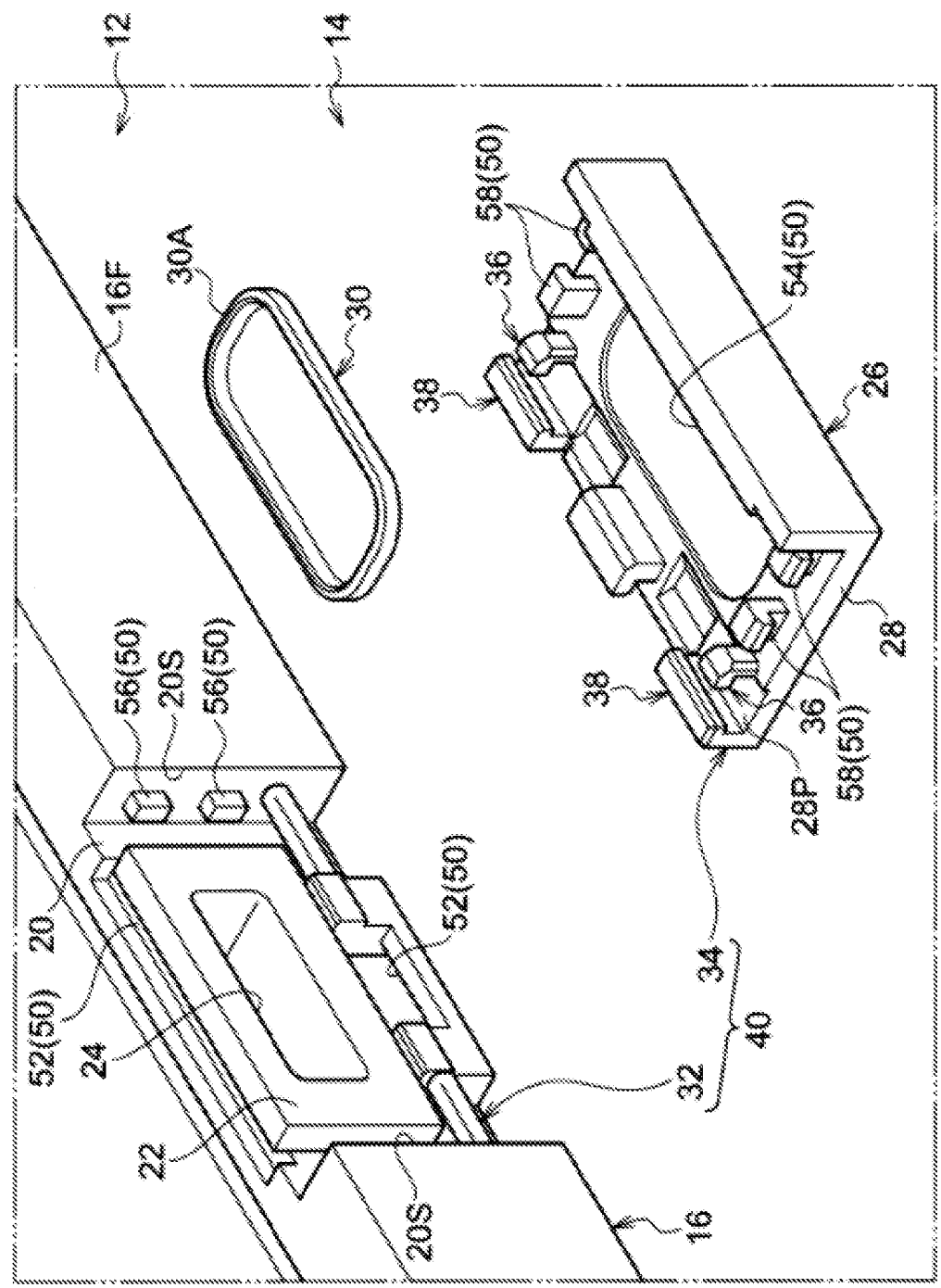
FIG. 2 illustrates an example of an exploded perspective view of an electronic device.
Figure 3:
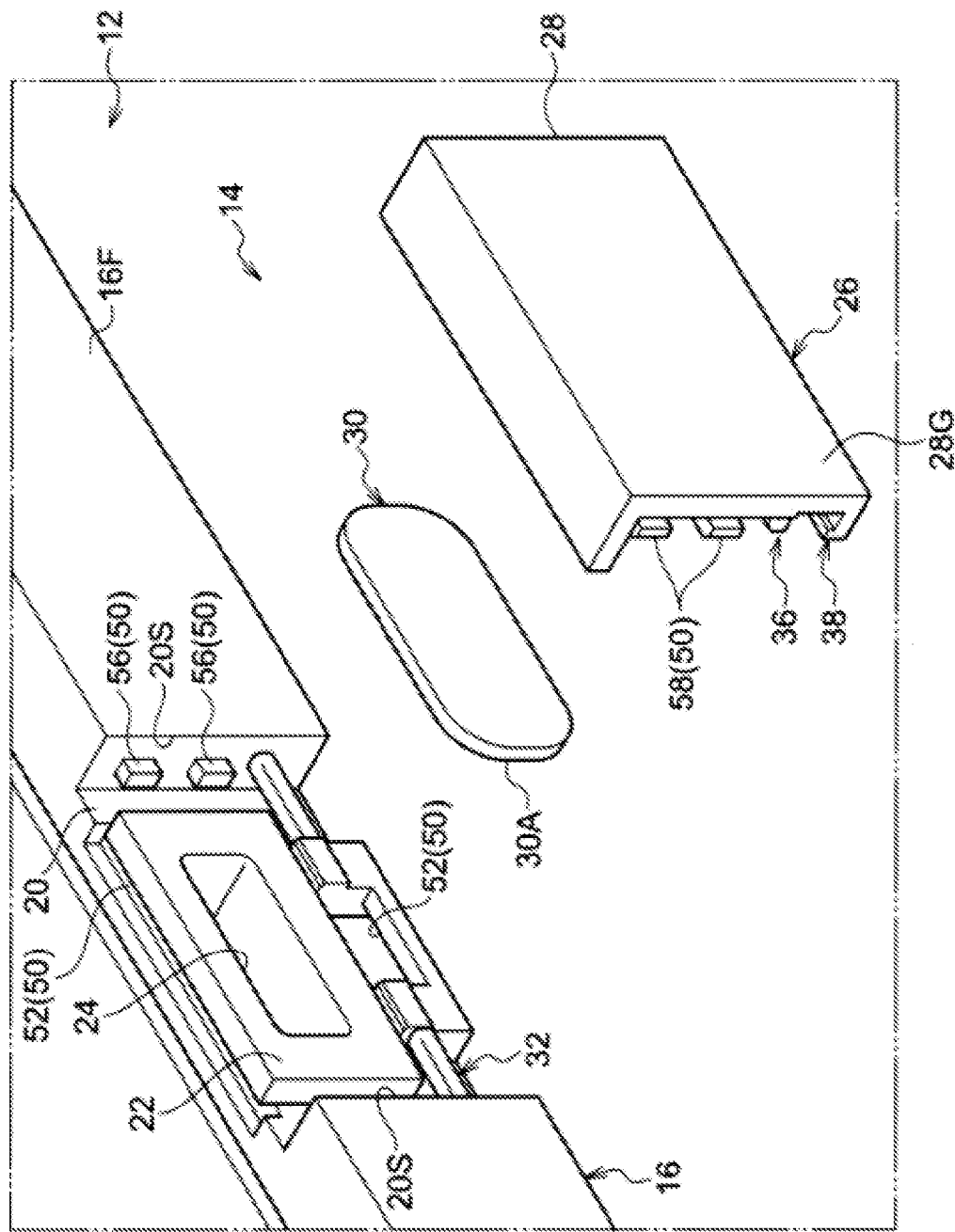
FIG. 3 illustrates an example of an exploded perspective view of an electronic device.

FIGS. 1 through 3 illustrate an example of an exploded perspective view of an electronic device. An electronic device 12 illustrated in FIGS. 1 through 3 is provided with a lid structure 14 and includes a housing 16. The housing 16 illustrated in FIG. 1 is formed in a flat rectangular parallelepiped box shape. Inside the housing 16, an electronic component 18 is provided. The electronic device 12 may be, for example, a mobile device, such as a smartphone, a mobile phone, a camera, and a portable audio player, a notebook (laptop) computer, or the like.

An upward direction, a forward direction, and a width direction of the electronic device 12 are represented by an arrow UP, an arrow FR, and an arrow W, respectively. The "upward direction", "forward direction", and "width direction" are directions are for convenience of the description and do not limit a status of using the electronic device 12.

In one side surface 16F of the housing 16 of the electronic device 12, a recess portion 20 that is recessed partially in the center of the side surface 16F is formed. In a back side of the recess portion 20, an opening formation surface 22 that is parallel to the side surface 16F is formed. In the center of the opening formation surface 22, an opening 24 is formed. The opening 24 communicates inside and outside of the housing 16. For example, through the opening 24, a connecting member, such as a cable, may be coupled to the electronic component 18 inside the housing 16.

Figure 4:
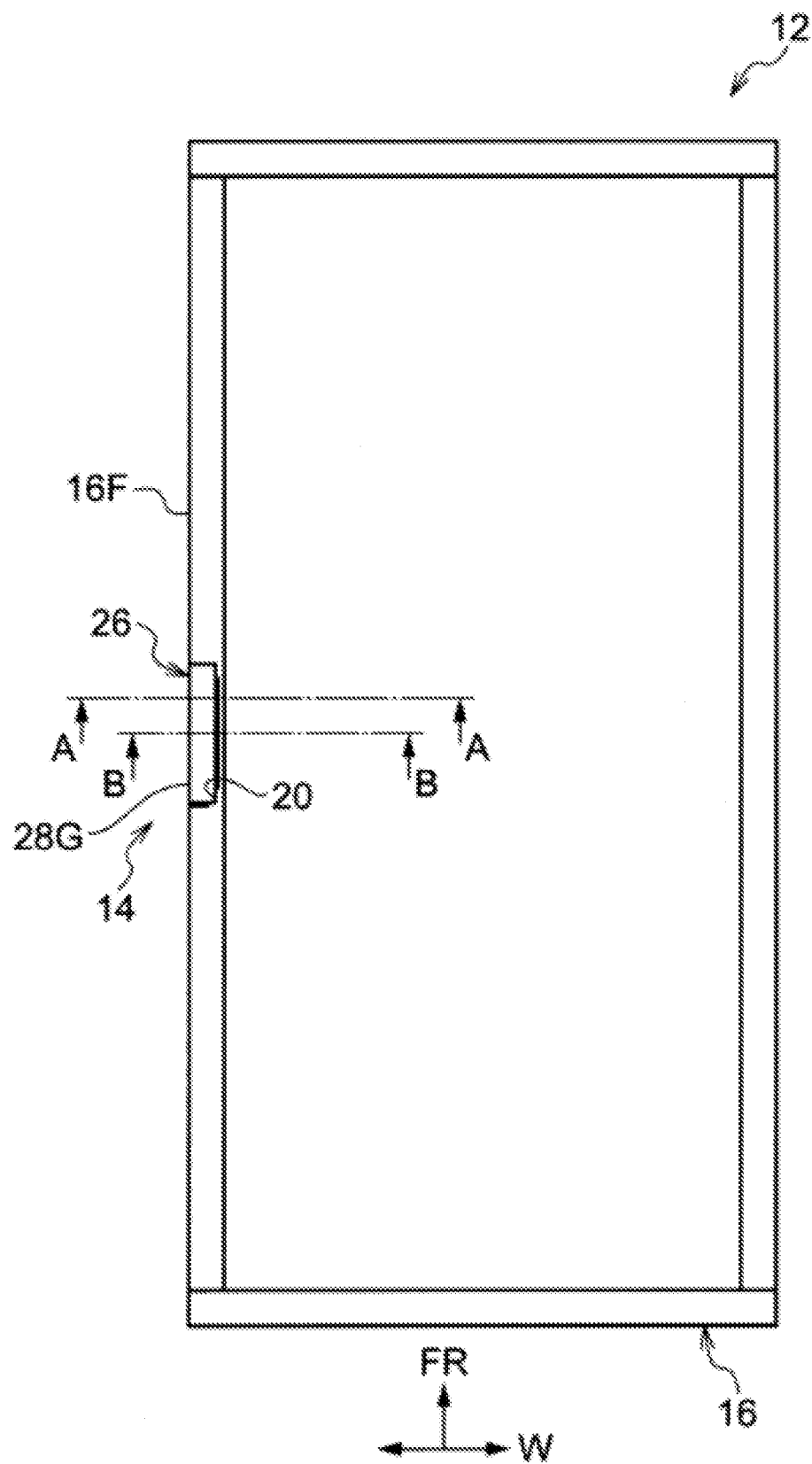
FIG. 4 illustrates an example of a plan view of an electronic device.
Figure 5:
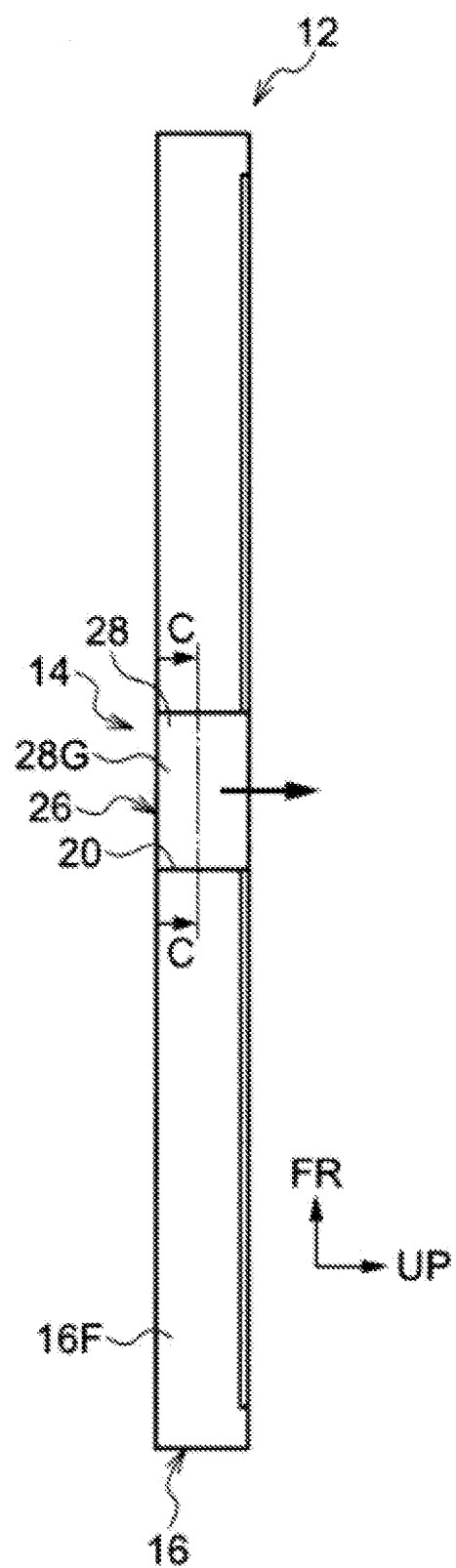
FIG. 5 illustrates an example of a side view of an electronic device.

In the recess portion 20, a lid body 26 is disposed. The lid body 26 includes a lid main body 28 that is stored in the recess portion 20. FIG. 5 illustrates an example of a side view of an electronic device. For example, when the lid main body 28 is in a closing position illustrated in FIGS. 4 and 5, an outer surface 28G of the lid main body 28 is continued to the side surface 16F of the housing 16 and the housing 16 and the lid body 26 make an integrated appearance.

An elastic member 30 is attached to the lid main body 28. The elastic member 30 may include a material having elasticity, for example, a synthetic rubber. When the lid main body 28 is in the closing position, the elastic member 30 includes a compression unit 30A that is formed in a closed curve form so as to surround the opening 24 and be sandwiched by the lid main body 28 and the opening formation surface 22 for pressure bonding.

Figure 6A:
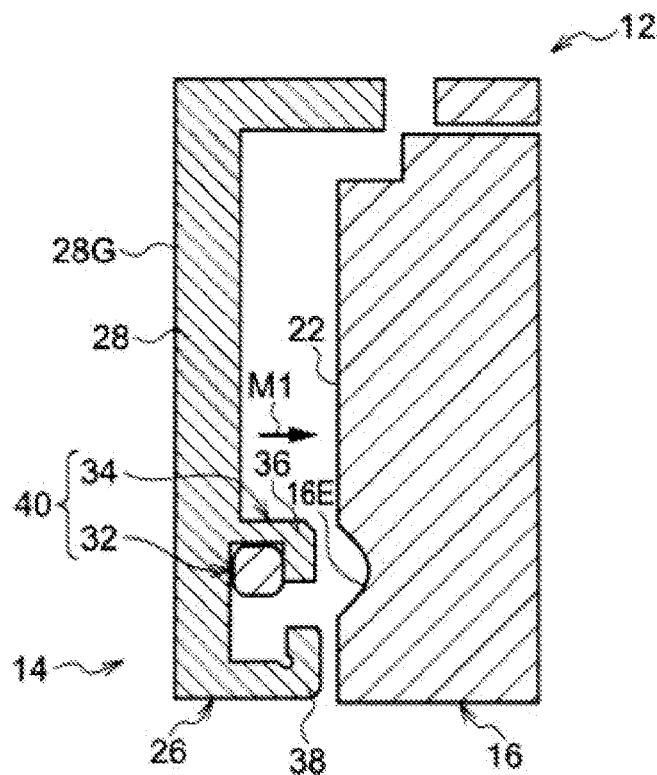
FIGS. 6A and 6B illustrate an example of a cross-sectional view of an electronic device.
Figure 6B:
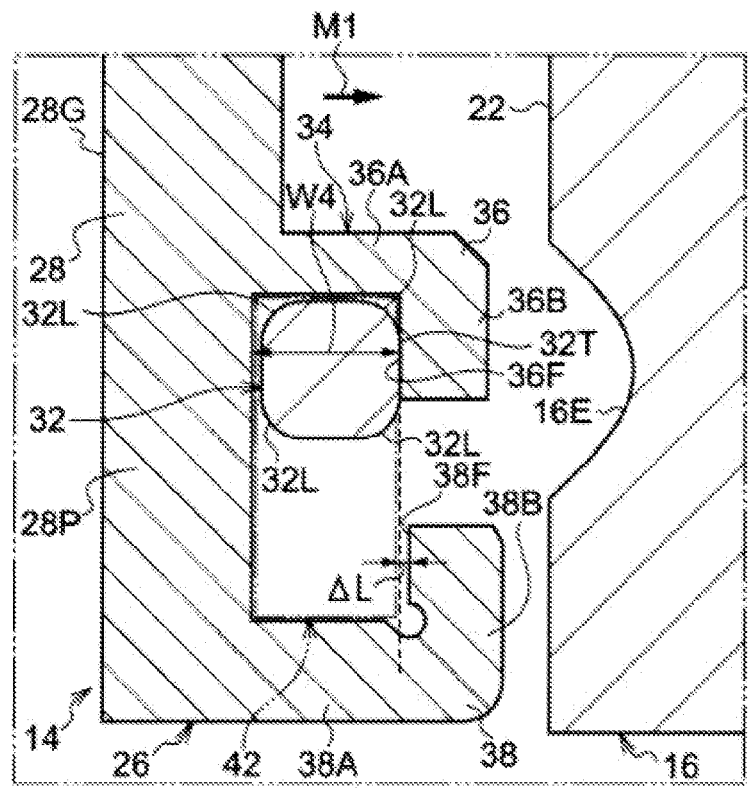

FIGS. 6A and 6B illustrate an example of a cross-sectional view of an electronic component. FIG. 6A illustrates an A-A cross-sectional view of FIG. 4 in the closing position of the lid body. FIG. 6B illustrates a cross-sectional view that is partially enlarged in a closing position of the lid body. As illustrated in FIGS. 6A and 6B, the lid body 26 is supported by a shaft member 40 to the housing 16. The shaft member 40 has a support shaft 32 and a shaft storage member 34. The lid body 26 is supported by the shaft member 40 in such a manner that the lid body 26 is movable along the opening formation surface 22 and also rotatable with the support shaft 32 as the center.

As illustrated in FIGS. 2 and 3, the support shaft 32 is equipped below the opening 24 in the recess portion 20. The support shaft 32 is supported along the opening formation surface 22 in a position separated from the opening formation surface 22 by side walls 20S of the recess portion 20.

As illustrated in FIGS. 6A and 6B, for example, the support shaft 32 may be quadrilateral (square) viewed from a cross section perpendicular to the longitudinal direction. Corner portions when the support shaft 32 is viewed in cross section may be long diameter portions 32L having a length from a center 32C longer than that from the four sides, for example, a plane. Outside of the corner portions (long diameter portions 32L) is curved.

The shaft storage member 34 is formed in a position facing the opening formation surface 22 in the lid main body 28. In FIG. 2, the shaft storage member 34 includes two narrow width members 36 positioned on both sides in a back-to-front direction, wide width members 38 corresponding to the narrow width members 36 on a one on one basis, and areas between the narrow width members 36 and the wide width members 38 in the lid main body 28.

As illustrated in FIG. 6B, the wide width members 38 and the narrow width members 36 have base end portions 36A and 38A extended from the lid main body 28 viewed in the back-to-front direction (arrow FR direction). The narrow width members 36 and the wide width members 38 further have extended portions 36B and 38B extended from tip ends of the base end portions 36A and 38A in directions coming close to each other, respectively. The area between the lid main body 28 and the shaft storage member 34 (the wide width members 38 and the narrow width members 36) is a shaft storage region 42 in an approximately rectangular shape that stores the support shaft 32.

Figure 7A:
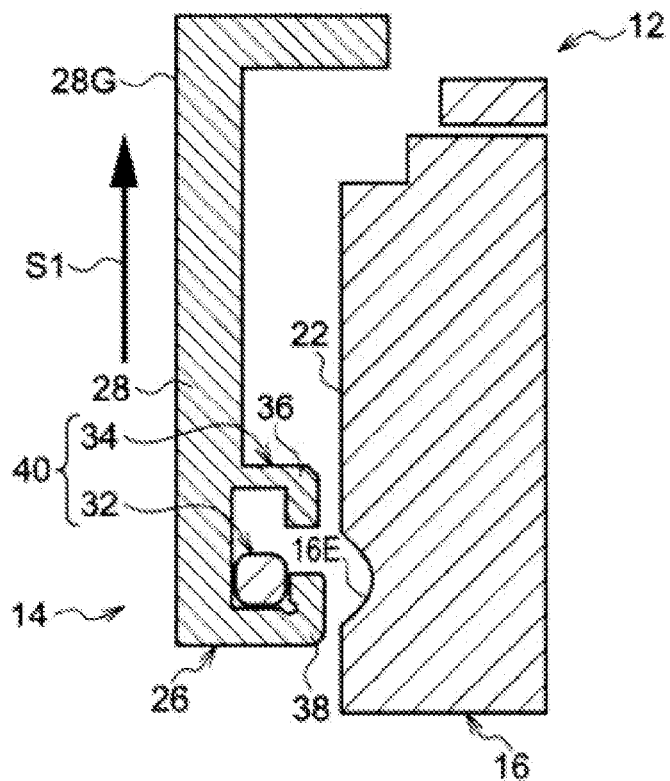
FIGS. 7A and 7B illustrate an example of a cross-sectional view of an electronic device.
Figure 7B:
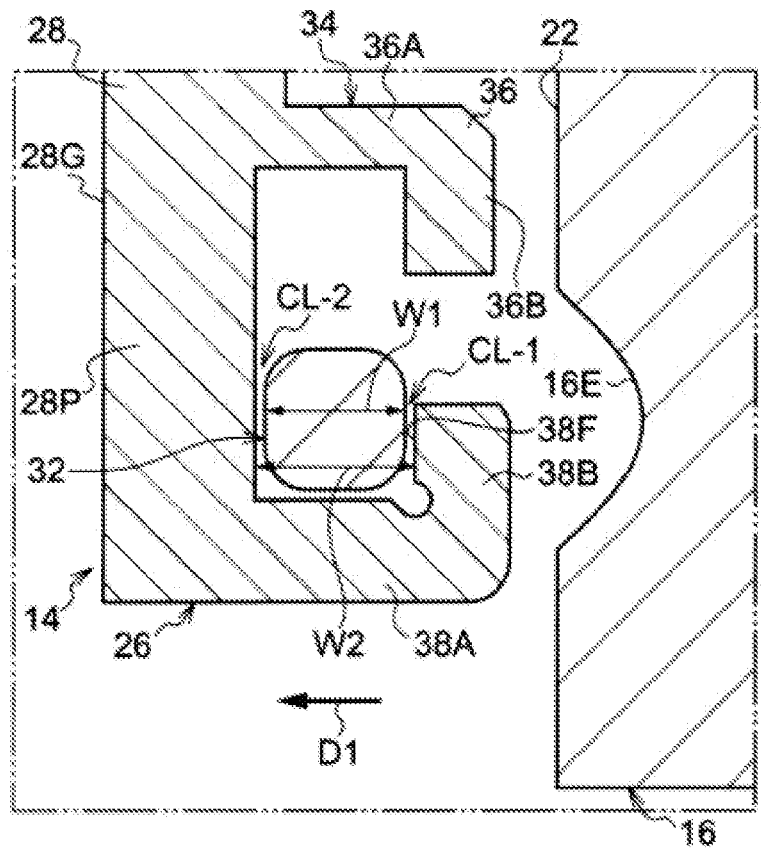

FIGS. 7A and 7B illustrate an example of a cross-sectional view of an electronic component. FIG. 7A illustrates a cross-sectional view similar to FIG. 6A in a facing position of the lid body. FIG. 7B illustrates a cross-sectional view that is partially enlarged in the facing position of the lid body. The support shaft 32 is stored in the shaft storage region 42 movably in longitudinal directions (vertical directions) of the shaft storage region 42. For example, since the lid body 26 slides relative to the housing 16, the shaft storage member 34 moves vertically relative to the support shaft 32. Therefore, the lid body 26 slides between the closing position (refer to FIG. 6A) and the facing position (refer to FIG. 7A). In the closing position, the lid body 26 is below the housing 16 and also gets into the recess portion 20. In contrast, in the facing position, the lid body 26 is above the closing position and also faces the opening formation surface 22. The sliding directions of the lid body 26 are an arrow S1 direction illustrated in FIG. 7A and an opposite direction thereof and are parallel to the opening formation surface 22.

As illustrated in FIG. 7B, between the extended portion 38B of the wide width member 38 and the lid main body 28, a wide width portion 48 having a width W2 wider than the shaft width W1 (a length of one side of a square cross-section) of the support shaft 32 is formed.

As illustrated in FIG. 7B, when the support shaft 32 is in the wide width portion 48, clearances CL-1 and CL-2 are created between the support shaft 32 and, the extended portions 38B and the lid main body 28. By the creation of the clearances CL-1 and CL-2, the lid body 26 becomes movable in directions being separated from (an arrow D1 direction) and coming close to the opening formation surface 22. Due to the movement, one of the clearances may become wider and the other clearance narrower (or removed).

Figure 8A:
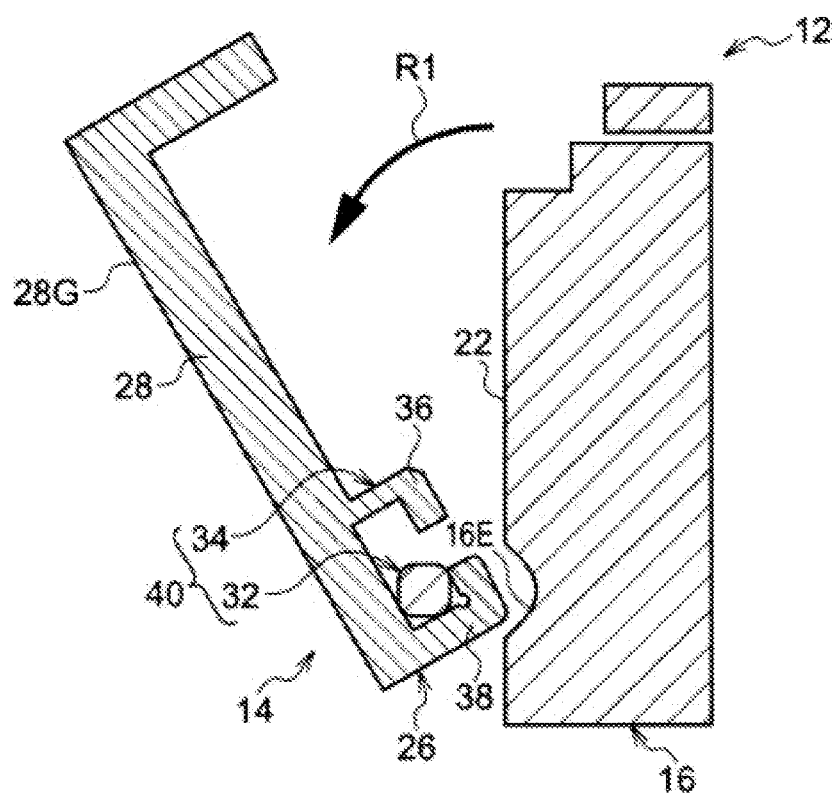
FIGS. 8A and 8B illustrate an example of a cross-sectional view of an electronic device.
Figure 8B:
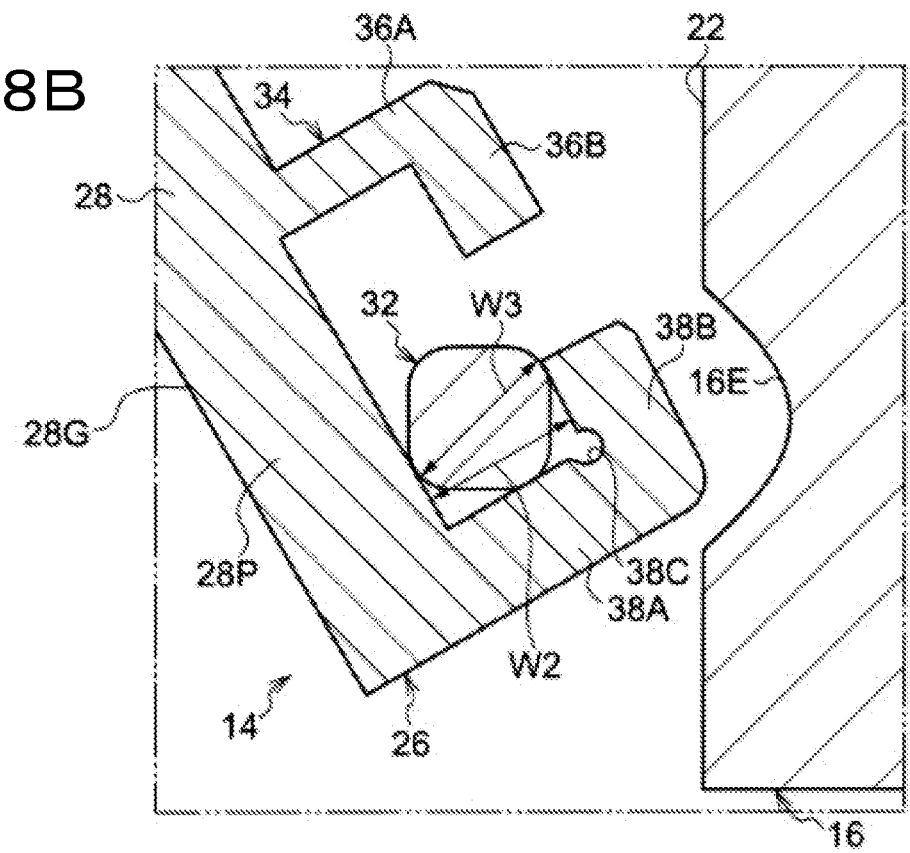

FIGS. 8A and 8B illustrate an example of a cross-sectional view of an electronic component. FIG. 8A illustrates a cross-sectional view similar to FIG. 6A in a state during rotation of the lid body. FIG. 8B illustrates a cross-sectional view that is partially enlarged in a state during rotation of the lid body. As illustrated in FIG. 8B, the width W2 of the wide width portion 48 is formed narrower than a diagonal length W3 (a length of a diagonal line of a square cross-section) of the support shaft 32. When trying to rotate the lid body 26 in an arrow R1 direction (refer to FIG. 8A) with the support shaft 32 as the center in a state where the support shaft 32 is in the wide width portion 48, the long diameter portions 32L of the support shaft 32 may make contact with the lid main body 28 and the wide width member 38 during the rotation and rotation resistance may occur.

In the housing 16, a relief portion 16E not to let the lid body 26 make contact therewith while rotation is formed.

When a torque is applied to the lid body 26, the wide width member 38 is pressed by the support shaft 32 to be deformed and the width W2 is widened, and thus the rotation may be carried out subsequently. When the lid body 26 is further rotated, the long diameter portions 32L leave the lid main body 28 and the extended portion 38B and the shape of the extended portion 38B is restored. In such a manner, due to the creation of resistance during rotation of the lid body 26, a clicking feeling for rotation may be applied to a rotation operator.

Since a thin wall portion 38C is formed between the base end portion 38A and the extended portion 38B of the wide width member 38, the extended portion 38B is easily deformed.

Figure 9A:
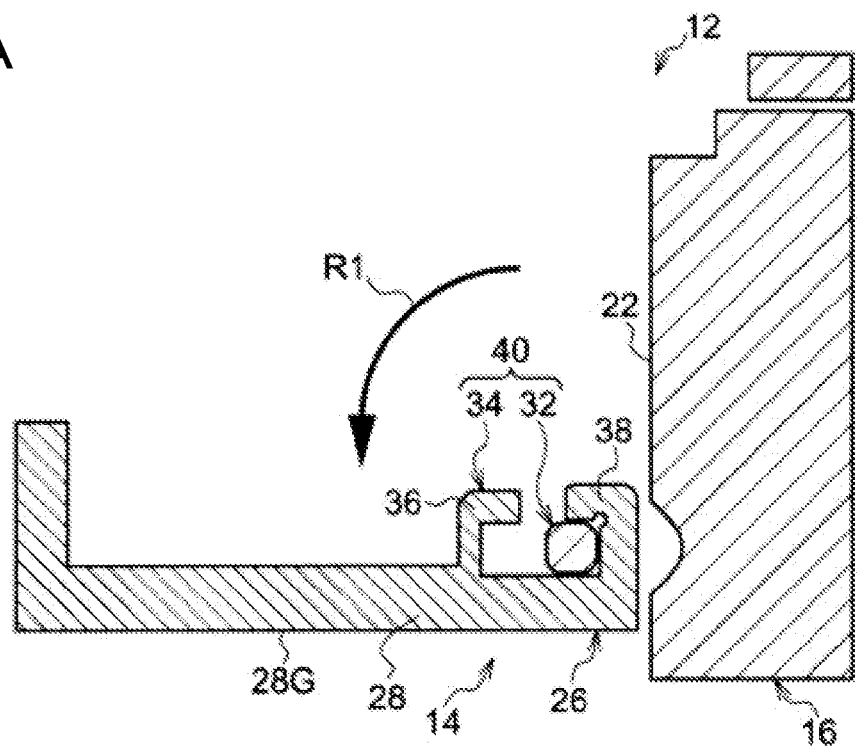
FIGS. 9A and 9B illustrate an example of a cross-sectional view of an electronic device.
Figure 9B:
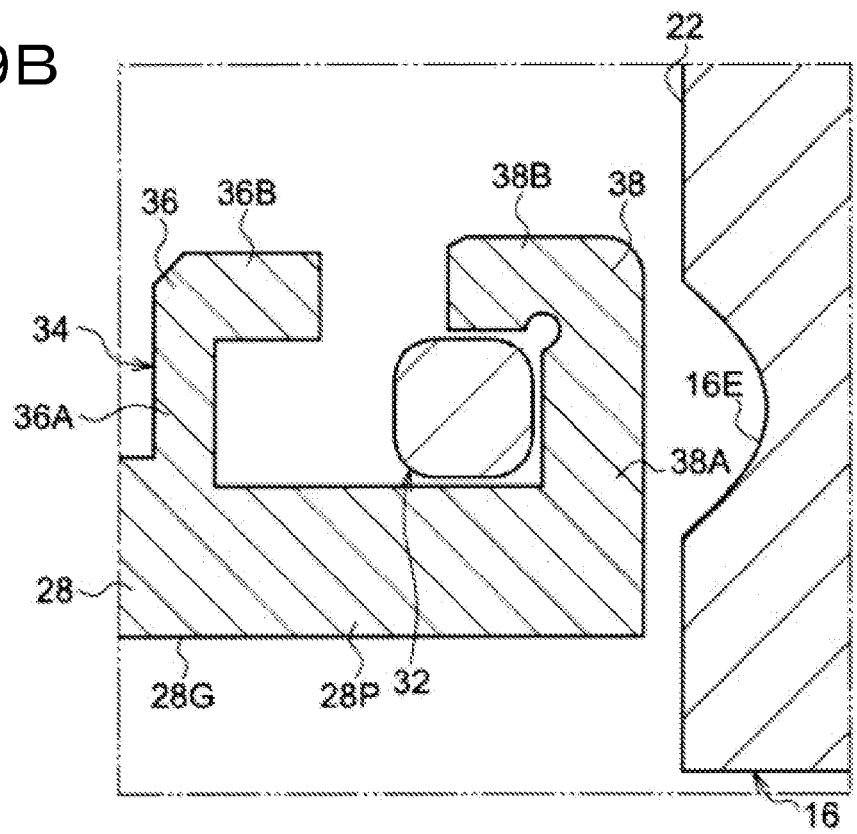

FIGS. 9A and 9B illustrate an example of a cross-sectional view of an electronic component. FIG. 9A illustrates a cross-sectional view similar to FIG. 6A in an opening position of the lid body. FIG. 9B illustrates a line cross-sectional view that is partially enlarged in an opening position of the lid body. As illustrated in FIGS. 9A and 9B, the lid body 26 is rotatable at an angle of approximately 90 degrees from the facing position. The position of the lid body 26 rotated at approximately 90 degrees may correspond to the opening position, and the opening 24 is opened. When the lid body 26 is in the opening position, a cable may be coupled to the electronic component 18 in the housing 16 through the opening 24. In the opening position, by making a part of the lid body 26 contact with a part of the housing 16, rotation of the lid body 26 in the arrow R1 direction more than that may be avoided.

As illustrated in FIG. 6B, a width W4 against the extended portion 36B of the narrow width member 36 is narrower than the width W2 of the wide width portion 48. A facing surface 36F to the lid main body 28 in the narrow width member 36 is positioned on the lid main body 28 side closer than a facing surface 38F to the lid main body 28 in the wide width member 38. A difference ΔL between positions of the facing surface 36F and the facing surface 38F may be the same or more than an amount of compression of the elastic member 30 when the lid body 26 is in the closing position.

Figure 10:
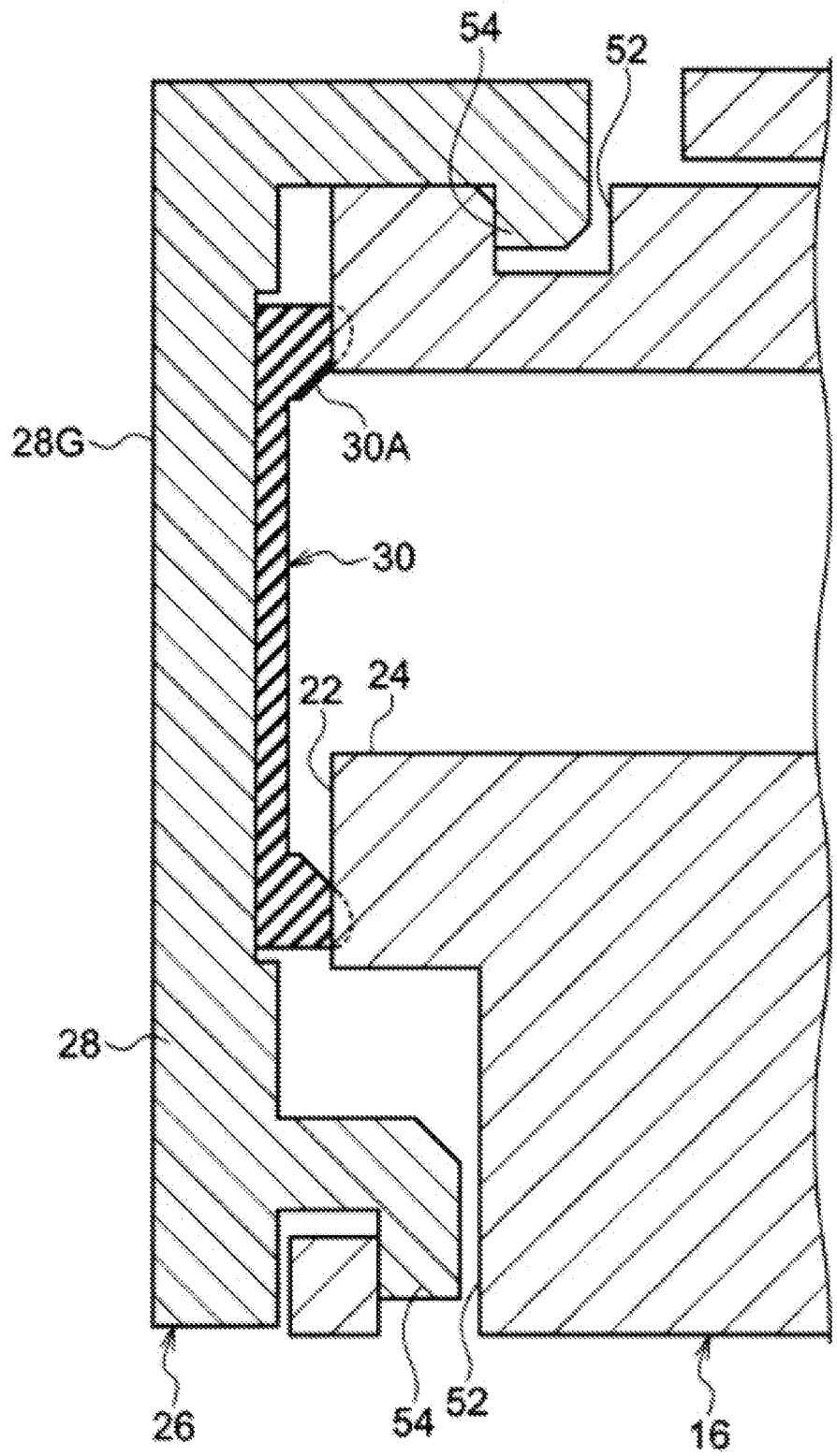
FIG. 10 illustrates an example of a cross-sectional view of an electronic device.

As illustrated in FIGS. 6A and 6B, when the support shaft 32 is in a narrow width portion 46, the clearance between the shaft storage member 34 and the support shaft 32 (refer to the clearance CL-1 illustrated in FIG. 7B) is removed and the narrow width member 36 interferes with the support shaft 32. Therefore, a force to press the lid body 26 in a direction coming close to the opening formation surface 22 (arrow M1 direction) is applied. For example, when the lid body 26 slides from the facing position to the closing position (in a direction opposite to the arrow S1), due to this sliding, the lid body 26 comes close to the opening formation surface 22 from the front. FIG. 10 illustrates an example of a cross-sectional view of an electronic component. FIG. 10 illustrates a B-B line cross-sectional view of FIG. 4 in a closing position of the lid body. In a state where the lid body 26 is in the closing position, as illustrated in FIG. 10, the compression unit 30A of the elastic member 30 is pressed against the opening formation surface 22 in a position surrounding the opening 24 for tight attachment.

For example, a cross section of the support shaft 32 may be in a quadrilateral (square) shape, and a contact surface 32T of the support shaft 32 and the facing surface 36F of the narrow width member 36 may make surface contact on a surface perpendicular to the direction that the lid body 26 comes close.

As illustrated in FIGS. 2 and 3, for example, in the lid structure 14, fit-in members 50 may be equipped in predetermined positions around the opening 24. The fit-in members 50 include fit-in grooves 52 and fit-in nails 54 that fit in the fit-in grooves 52. The fit-in members 50 include fit-in projections 56 and fit-in nails 58 that fit in the fit-in projections 56.

Figure 11:
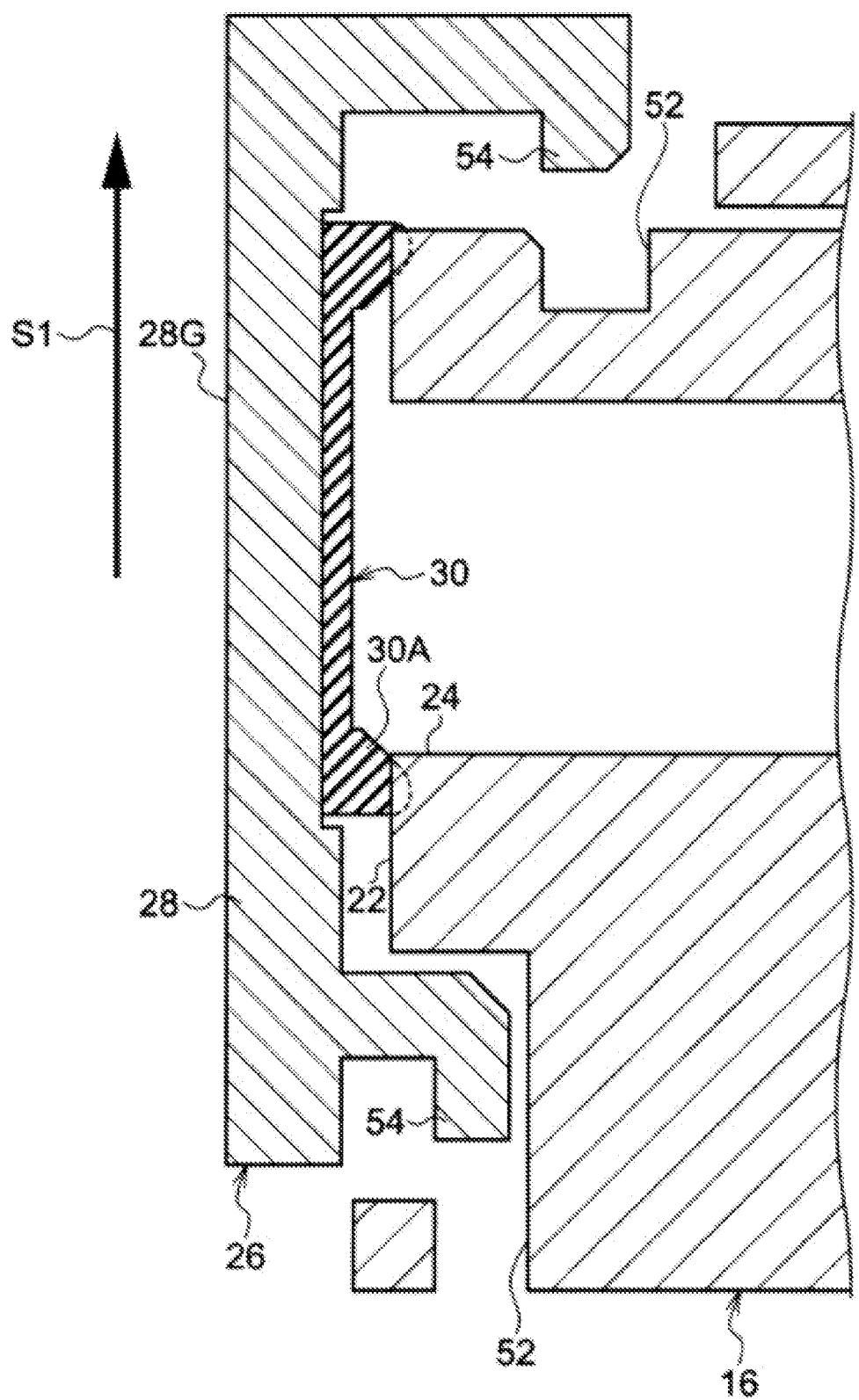
FIG. 11 illustrates an example of a cross-sectional view of an electronic device.

FIG. 11 illustrates an example of a cross-sectional view of an electronic component. FIG. 11 illustrates a cross-sectional view similar to FIG. 10 in a facing position of the lid body. As illustrated in FIGS. 10 and 11, the fit-in grooves 52 are formed above and below the opening 24 in the housing 16. Both of the two fit-in grooves 52 are formed along the back-to-front direction (the arrow FR direction and an opposite direction thereof) of the housing 16.

The fit-in nails 54 may be equipped, for example, two corresponding to the respective fit-in grooves 52. As illustrated in FIG. 11, the two fit-in nails 54 are not fit in the fit-in grooves 52 (unfit state) when the lid body 26 is in the facing position. As illustrated in FIG. 10, when the lid body 26 slides from the facing position to the closing position, the fit-in nails 54 fit in the fit-in grooves 52 (fit state).

The fit-in projections 56 are formed one or a plurality, for example in FIGS. 2 and 3, vertically two each, four in total, respectively on both sides of the opening 24 in the opening formation surface 22. In contrast, the fit-in nails 58 are formed as same number as the fit-in projections 56 so as to correspond on a one on one basis in the lid main body 28.

Figure 12:
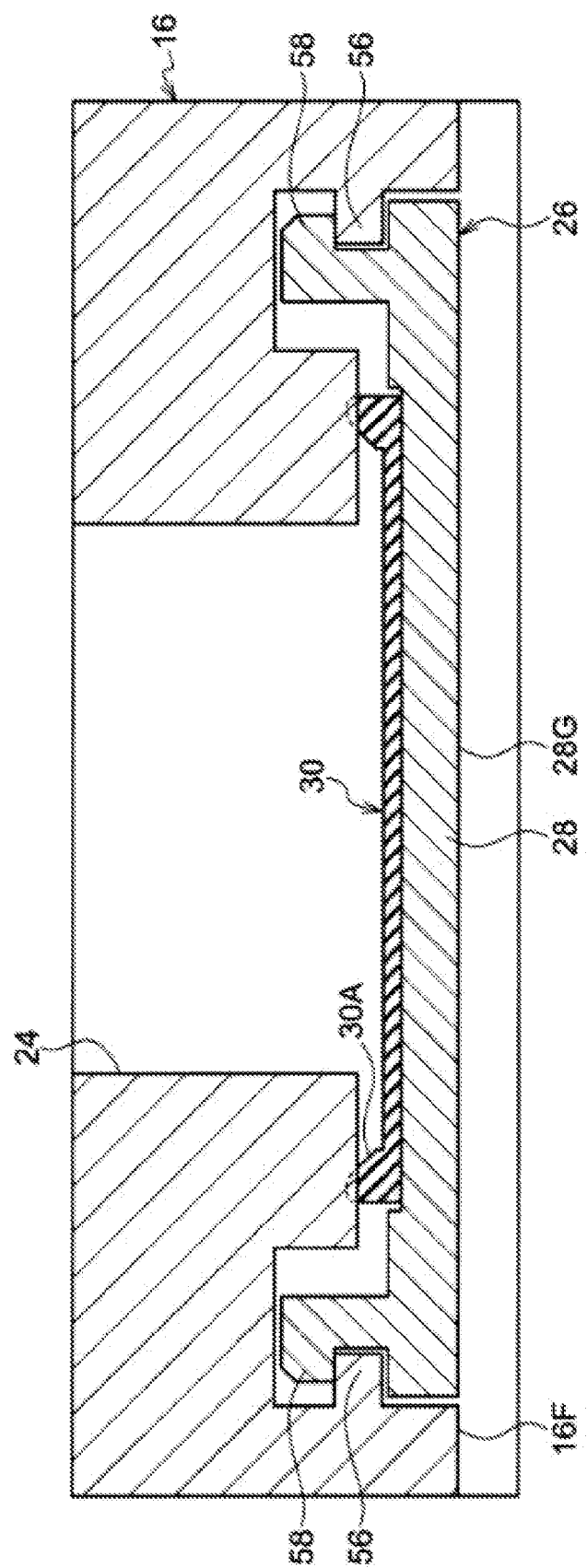
FIG. 12 illustrates an example of a cross-sectional view of an electronic device.
Figure 13:
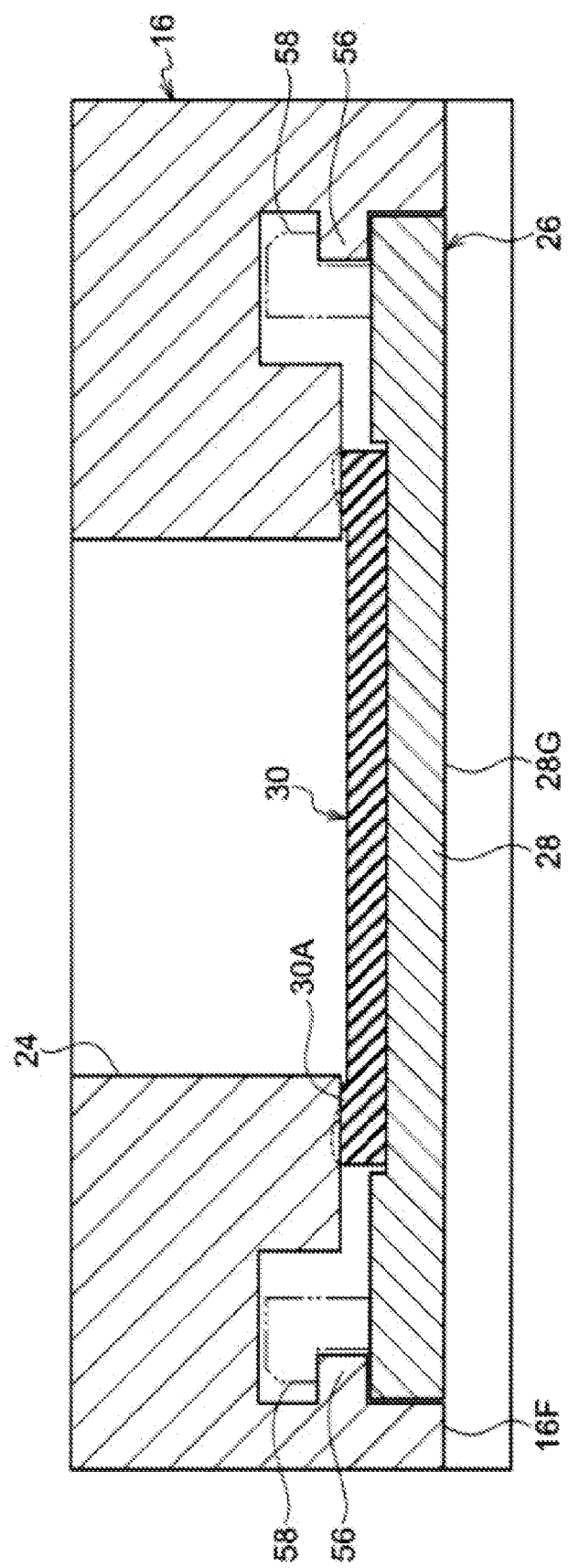
FIG. 13 illustrates an example of a cross-sectional view of an electronic device.

The fit-in nails 58 are formed in positions not interfering with the fit-in projections 56 when the lid body 26 rotates between the facing position and the opening position. FIG. 12 illustrates an example of a cross-sectional view of an electronic component. FIG. 12 illustrates a C-C line cross-sectional view of FIG. 5 in a closing position of the lid body. FIG. 13 illustrates an example of a cross-sectional view of an electronic component. FIG. 13 illustrates a cross-sectional view similar to FIG. 10 in a facing position of the lid body. As illustrated in FIG. 13, when the lid body 26 is in the facing position, the fit-in nails 58 are above from the fit-in projections 56 and do not fit in the fit-in projections 56 (unfit state).

When the lid body 26 slides from the facing position to the closing position (in a direction opposite to the arrow S1 in FIG. 7A), the fit-in nails 58 get between the fit-in projections 56 and the opening formation surface 22 to be fit in the fit-in projections 56 (fit state).

When the fit-in members 50 are in the fit state, the fit-in nails 54 fit in the fit-in grooves 52 and the fit-in nails 58 fit in the fit-in projections 56, so that a position shift of the lid body 26 from the housing 16 may be reduced. In particular, even when a force in a direction being separated from the housing 16, vertical directions, or lateral directions is applied to the lid body 26 due to an elastic reaction force of the elastic member 30, a shift of the lid body 26 is suppressed.

As illustrated in FIGS. 6A and 10, when the lid body 26 is in the closing position, the opening 24 of the housing 16 is closed by the lid main body 28. For example, as illustrated in FIG. 6B, the narrow width portion 46 interferes with the support shaft 32, thereby applying a force to press the lid body 26 in the direction coming close to the opening formation surface 22 (arrow M1 direction). Therefore, the compression unit 30A of the elastic member 30 is tightly attached to the opening formation surface 22. Entrance of foreign substances, such as liquids and dusts, from outside to the opening 24 may be reduced.

For example, when the lid body 26 is in the closing position, the lid body 26 is pressed against the opening formation surface 22 from the front. Therefore, even when the elastic reaction force of the elastic member 30 is applied to a direction being separated from the opening formation surface 22 (a direction opposite to the arrow M1), the lid body 26 is pressed against the opening formation surface 22 by the force in a direction opposite to the elastic reaction force for retention. Since the lid body 26 is maintained (locked) in the closing position without using a member to lock the lid body 26 in the closing position, a number of components may be less in comparison with a structure provided with a member for locking. A member to lock the lid body 26 in the closing position may also be provided.

For example, the shaft member 40 may carry out both open and close behaviors to move the lid body 26 from the closing position to the facing position (and further to the opening position) and behaviors to lock the lid body 26 in the closing position. In comparison with a structure equipped with separate members to carry out these behaviors, the lid structure 14 and the electronic device 12 may be miniaturized.

As illustrated in FIG. 6B, the contact surface 32T of the support shaft 32 and the facing surface 36F of the narrow width member 36 make surface contact on the surface perpendicular to a direction of the lid body 26 coming close. Therefore, in comparison with a structure where the contact surface 32T and the facing surface 36F come close obliquely to the direction of the lid body 26 coming close, application of the elastic reaction force of the elastic member 30 to the lid body 26 as components of force in vertical directions or in lateral directions may be reduced. Therefore, an effect of maintaining the lid body 26 in the closing position may be high.

In comparison with a structure where the contact surface 32T and the facing surface 36F make line contact or point contact, the local contact load is not applied to the contact surface 32T and the facing surface 36F to be dispersed (to lower the surface pressure), so that durability of the support shaft 32 and the narrow width members 36 may be high.

The lid body 26 comes close to the opening formation surface 22 from the front, and the elastic member 30 is sandwiched by the lid main body 28 and the opening formation surface 22 for pressure bonding. Therefore, in comparison with a structure where the lid body 26 comes close to the opening formation surface 22 from an oblique direction, when the elastic member 30 is sandwiched by the lid main body 28 and the opening formation surface 22, deformation in an oblique direction in the elastic member 30 may not be easily created. For example, in a state where the elastic member 30 is tightly attached to the opening formation surface 22, the compression unit 30A of the elastic member 30 is compressed from the front (the shape during compression is close to uniform), so that ingress of water and foreign substances may be reduced.

In certain positions around the opening 24, the fit-in members 50 are equipped, and when the lid body 26 is in the closing position, a shift in vertical directions and lateral directions relative to the housing 16 may be reduced. Therefore, deformation of the compression unit 30A of the elastic member 30 so as to collapse may be reduced to maintain the state of being compressed from the front.

For example, since the lid body 26 is maintained in the closing position by the fitting in of the fit-in members 50, a member to fix the lid body 26 in the closing position and the like may be omitted to maintain the lid body 26 in the closing position by a simple structure. The fit-in grooves 52 and the fit-in projections 56 are formed in the housing 16, and the fit-in nails 54 and 58 are formed in the lid body 26. Since the housing 16 and the lid body 26 are not equipped separately as the fit-in members 50, the number of components may not be increased.

As illustrated in FIGS. 11 and 13, the fit-in members 50 do not fit in when the lid body 26 is in the facing position. Therefore, rotation of the lid body 26 from the facing position to the opening position (arrow R1 illustrated in FIGS. 8A and 9A) and rotation from the opening position to the facing position may not be inhibited.

In such a manner, when the lid body 26 is in the facing position, the fit-in members 50 do not fit in. As illustrated in FIG. 7B, the support shaft 32 is in the wide width portion 48, and the clearance CL-1 or CL-2 is created between the support shaft 32 and at least one of the lid main body 28 and the wide width member 38. Therefore, as illustrated by the arrow R1 in FIGS. 8A and 9A, the lid body 26 may rotate with the support shaft 32 as the center from the facing position to the opening position.

In the support shaft 32, the long diameter portions 32L are formed and the diagonal length W3 of the square cross-section is longer than the width W2 of the wide width portion 48. Therefore, as illustrated in FIG. 8B, while the lid body 26 is rotated from the facing position to the opening position, the long diameter portions 32L may interfere with the lid main body 28 and the wide width member 38 to create resistance in the rotation of the lid body 26. By an application of the force to rotate to the opening position to the lid body 26, the wide width member 38 is deformed and the width W2 is widened temporarily, which allows further rotation of the lid body 26. By the creation of resistance during rotation of the lid body 26, rotation at once may be reduced. An appropriate resisting feeling (clicking feeling) may be created in rotation of the lid body 26. The operator carrying out a rotation operation of the lid body 26 is able to confirm that the lid body 26 is reached securely in the opening position by feeling the resisting feeling when rotating the lid body 26 to the opening position.

The wide width member 38 is deformed by being pressed by the long diameter portions 32L of the support shaft 32 due to rotation of the lid body 26. In such a manner, the width W2 is widened by the deformation of the wide width member 38 to allow rotation of the lid body 26, so that a member or a structure to widen the width W2 may be omitted.

When the long diameter portions 32L of the support shaft 32 override an interference position with the lid main body 28 and the wide width member 38, the wide width member 38 is elastically restored to the shape before the interference.

As illustrated in FIGS. 9A and 9B, in a state where the lid body 26 is in the opening position, a part of the lid body 26 and a part of the housing 16 may make contact to reduce rotation of the lid body 26 in the arrow R1 direction more than that.

Even when a force to rotate in the facing position is applied to the lid body 26 unintentionally, the long diameter portions 32L interferes with the lid main body 28 and the wide width member 38 during the rotation, which creates resistance in the rotation of the lid body 26. Therefore, unintentional rotation behaviors (reverse rotation behaviors) may be reduced. Since the state of opening the opening 24 is maintained securely, even when a connecting member is inserted into the opening 24, the lid body 26 may not be an obstacle.

Since the opening 24 is widely opened in a state where the lid body 26 is in the opening position, an operation to plug a cable and the like in and out of the housing 16 from the opening 24 may be easier.

When the lid body 26 is rotated from the opening position to the facing position as well, the long diameter portions 32L interfere with the lid main body 28 and the wide width member 38 during the rotation to create resistance in the rotation of the lid body 26. When a force to rotate in the facing position is applied to the lid body 26, the wide width member 38 is deformed to temporarily widen the width W2, which allows further rotation of the lid body 26. For example, by the creation of resistance during the rotation of the lid body 26 similar to when the lid body 26 is rotated from the facing position to the opening position, rotation at once may be reduced and also a clicking feeling may be created in rotation.

The fit-in nails 54 and 58 are formed in positions not interfering respectively with the fit-in grooves 52 and the fit-in projections 56 when the lid body 26 is in the facing position. Therefore, the lid body 26 may rotate in the facing position.

When the lid body 26 is in the facing position, the support shaft 32 is positioned in the wide width portion 48. In the wide width portion 48, the clearance CL-1 or CL-2 is created between the support shaft 32 and at least one of the wide width member 38 and the lid main body 28, so that the lid body 26 may not be pressed against the opening formation surface 22. The elastic member 30 is separated from the opening formation surface 22.

When the lid body 26 slides from the facing position to the closing position, the wide width member 38 and the narrow width member 36 also slide, so that the support shaft 32 moves relatively from the wide width portion 48 to the narrow width portion 46.

A material of the elastic member 30 may be a synthetic rubber. A material of the elastic member 30 may be a material that is elastically compressed between the lid body 26 and the housing 16 (opening formation surface 22) and become water-impermeable in the compressed state. For example, a foam having respectively independent bubbles and an elastomer (a thermoplastic elastomer, a thermosetting elastomer, and the like) may be used. When a synthetic rubber or an elastomer is used as the elastic member 30, the elastic member 30 and the lid body 26 may be manufactured in a series of manufacturing procedures by insert molding, two color molding, and the like.

The elastic member using a synthetic rubber or an elastomer may exhibit sufficient elasticity relative to the compression force. Therefore, when the lid body 26 is in the closing position, the elastic member 30 is compressed to the opening formation surface 22 from the front and is tightly attached to the opening formation surface 22 to maintain a state of closing the opening 24, which may reduce ingress of water and foreign substances.

The shaft storage member 34 may be in a structure having the wide width portion 48 and the narrow width portion 46. In such a manner, the shaft storage member 34 is in a simple structure having the wide width portion 48 and the narrow width portion 46, so that the support shaft 32 may be stored movably between the wide width portion 48 and the narrow width portion 46. Due to the simple structure having the narrow width portion 46, the shaft storage member 34 may interferes with the support shaft 32 to cause the lid body 26 to come close to the opening formation surface 22 from the front. Further, in the wide width portion 48 continuing from the narrow width portion 46, a clearance may be created in an area with the support shaft 32.

The shaft member 40 may be in a structure having the support shaft 32 equipped in the housing 16 and the shaft storage member 34 equipped in the lid body 26. For example, in the shaft member 40, a support shaft may be equipped in the lid body 26 and the shaft storage member 34 may be equipped in the housing 16. When the support shaft 32 is equipped in the housing 16 and the lid body 26 is equipped in the shaft storage member 34, the shaft storage member 34 may not be formed in the recess portion 20 of the housing 16. For example, since the structure within the recess portion 20 becomes simple, mold release (detaching a finished housing from the mold) while molding the housing 16 may become easier.

The support shaft 32 may also be integrally molded with the housing 16, and a support shaft separate from the housing 16 may also be attached to the housing 16 with an attachment member or the like. The support shaft 32 may also be a material different from the housing 16, for example, metal.

A cross-sectional shape of the support shaft 32 may also be in a quadrilateral column shape (having a cross section in a quadrilateral shape), and may be in a structure having at least one contact surface 32T. When the lid body 26 is in the closing position, surface contact is made with the facing surface 36F of the narrow width member 36. When the cross section is in a polygonal shape having long diameter portions not in the quadrilateral shape, a clicking feeling may be created while rotation of the lid body 26.

As the cross-sectional shape of the support shaft 32 getting close to a circle, the area of the contact surface 32T may decrease. When the support shaft 32 is in a quadrilateral column shape, the area of the contact surface 32T may increase. The support shaft 32 may be in a triangular column shape. When the support shaft 32 is in a quadrilateral column shape, the strength may be enhanced more than the support shaft in a triangular column shape.

When the lid body 26 is in the closing position, the member to suppress the shift in the lid body 26 relative to the housing 16 may be the fit-in members 50. For example, by bridging a member separate from the lid body 26 and housing 16 over the lid body 26 and the housing 16, a member to be locked to the lid body 26 and the housing 16 with each other may also be equipped. In the fit-in members 50, the fit-in grooves 52 and the fit-in projections 56 are formed in the housing 16 and the fit-in nails 54 and 58 are formed in the lid body 26, so that the number of components may not be increased. In association with the behaviors of the lid body 26 to move between the facing position and the closing position, the fit state and the unfit state may be easily switched.

The electronic device 12 may be, for example, a mobile device such as a mobile phone, a smartphone, and a camera or a computer (of a notebook type, a desktop type, or a tablet type).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A lid structure comprising:
   a housing;
   a lid body that opens and closes an opening of the housing;
   an elastic member that is compressed by the housing and the lid body around the opening in a closing position where the lid body closes the opening;
   a shaft member that allows movement of the lid body along an opening formation surface where the opening is formed and move the lid body close to the opening formation surface from front to move the lid body from a facing position of facing around the opening to the closing position;
   a support shaft along the opening formation surface of the housing; and
   at least two shaft storage members, provided on at least two sides of the lid body, respectively, that stores the support shaft,
   wherein each of the at least two shaft storage members includes:
      a first portion including a first projection portion which projects from a surface of the lid body toward the housing and a first end portion which bends along the opening formation surface at an end of the first projection portion, the first projection portion, the first end portion and a first part of the lid body forming a first recess portion; and
      a second portion including a second projection portion which projects from the surface of the lid body toward the housing and a second end portion which bends along the opening formation surface at an end of the second projection portion such that the second end portion faces the first end portion, the second projection portion, the second end portion and a second part of the lid body forming a second recess portion,
   wherein the support shaft slides between the first recess portion and the second recess portion to move the lid body between the closing position to the facing position.

2. The lid structure according to claim 1, wherein the support shaft is, in the closing position, in contact with the first portion and is, in the facing position, in contact with the second portion provided further out than the first portion.

3. The lid structure according to claim 1, wherein the shaft storage member creates a clearance between the support shaft and the shaft storage member before the movement of the lid body in the facing position and interferes with the support shaft in the closing position to cause the lid body to come close to the opening formation surface.

4. The lid structure according to claim 1, wherein the first portion is configured to be pressed by the support shaft when the lid body is in the closing position to cause the lid body to come close to the opening formation surface; and the second portion is continuously formed from the first member and is wider in width than the support shaft.

5. The lid structure according to claim 4, wherein the support shaft and the first portion include a contact surface to make surface contact facing a direction of the lid body coming close when the lid body is in the closing position.

6. The lid structure according to claim 4, wherein the lid body is rotatable relative to the housing with the support shaft as a center of rotation in the facing position when the support shaft is in the second portion.

7. The lid structure according to claim 6, wherein the support shaft includes a long diameter portion that makes contact with the shaft storage member during the rotation to create rotation resistance.

8. The lid structure according to claim 1, wherein the support shaft is in a quadrilateral column shape.

9. The lid structure according to claim 7, wherein the shaft storage member is deformed by the contact of the long diameter portion to allow the rotation of the support shaft.

10. The lid structure according to claim 1, comprising:
a shift suppression member configured to reduce a shift from the closing position along the opening formation surface when the lid body is in the closing position.

11. The lid structure according to claim 10, wherein the shift suppression member includes a fit-in member in the housing and the lid body and fits in the closing position to each other.

12. The lid structure according to claim 11, wherein the fit-in member is in an unfit state when the lid body is in the facing position and in a fit state when in the closing position.

13. The lid structure according to claim 1, wherein the elastic member includes a synthetic rubber or an elastomer.

14. An electronic device comprising:
a lid structure, the lid structure comprising:
a housing;
a lid body that opens and closes an opening of the housing;
an elastic member that is compressed by the housing and the lid body around the opening in a closing position where the lid body closes the opening;
a shaft member that allows movement of the lid body along an opening formation surface where the opening is formed and moves the lid body close to the opening formation surface from front to move the lid body from a facing position of facing around the opening to the closing position;
a support shaft along the opening formation surface of the housing; and
at least two shaft storage members, provided on at least two sides of the lid body, respectively, that store the support shaft,
wherein each of the at least two shaft storage members includes:
a first portion including a first projection portion which projects from a surface of the lid body toward the housing and a first end portion which bends along the opening formation surface at an end of the first projection portion, the first projection portion, the first end portion and a first part of the lid body forming a first recess portion; and
a second portion including a second projection portion which projects from the surface of the lid body toward the housing and a second end portion which bends along the opening formation surface at an end of the second projection portion such that the second end portion faces the first end portion, the second projection portion, the second end portion and a second part of the lid body forming a second recess portion,
wherein the support shaft slides between the first recess portion and the second recess portion to move the lid body between the closing position to the facing position.

15. The electronic device according to claim 14, wherein the support shaft is, in the closing position, in contact with the first portion and is, in the facing position, in contact with the second portion provided further out than the first portion.

16. The electronic device according to claim 14, wherein the shaft storage member creates a clearance between the support shaft and the shaft storage member before the movement of the lid body in the facing position and interferes with the support shaft in the closing position to cause the lid body to come close to the opening formation surface.

17. The electronic device according to claim 14, wherein the first portion is configured to be pressed by the support shaft when the lid body is in the closing position to cause the lid body to come close to the opening formation surface; and the second portion is continuously formed from the first member and is wider in width than the support shaft.

18. The electronic device according to claim 14, wherein the support shaft is in a quadrilateral column shape.

19. The electronic device according to claim 14, comprising:
a shift suppression member configured to reduce a shift from the closing position along the opening formation surface when the lid body is in the closing position.

20. The electronic device according to claim 14, wherein the elastic member includes a synthetic rubber or an elastomer.

* * * * *